(12) United States Patent
Templier et al.

(10) Patent No.: US 11,482,567 B2
(45) Date of Patent: Oct. 25, 2022

(54) LED EMISSIVE DISPLAY DEVICE AND METHOD FOR PRODUCING SUCH A DEVICE

(71) Applicant: Commissariat à l'Énergie Atomique et aux Énergies Alternatives, Paris (FR)

(72) Inventors: François Templier, Grenoble (FR); Séverine Cheramy, Grenoble (FR); Frank Fournel, Grenoble (FR)

(73) Assignee: Commissariat á l'Énergie Atomique et aux Énergies Alternatives, Paris (FR)

( * ) Notice: Subject to any disclaimer, the term of this patent is extended or adjusted under 35 U.S.C. 154(b) by 229 days.

(21) Appl. No.: 17/040,033

(22) PCT Filed: Mar. 18, 2019

(86) PCT No.: PCT/FR2019/050608
§ 371 (c)(1),
(2) Date: Sep. 21, 2020

(87) PCT Pub. No.: WO2019/180362
PCT Pub. Date: Sep. 26, 2019

(65) Prior Publication Data
US 2021/0020688 A1 Jan. 21, 2021

(30) Foreign Application Priority Data
Mar. 22, 2018 (FR) ........................................ 1852465

(51) Int. Cl.
*H01L 27/15* (2006.01)
*H01L 33/38* (2010.01)
(Continued)

(52) U.S. Cl.
CPC .......... *H01L 27/156* (2013.01); *H01L 25/167* (2013.01); *H01L 33/32* (2013.01);
(Continued)

(58) Field of Classification Search
None
See application file for complete search history.

(56) References Cited

U.S. PATENT DOCUMENTS

2016/0141469 A1* 5/2016 Robin ................... H01L 33/502
438/29

FOREIGN PATENT DOCUMENTS

| EP | 3 024 030 A1 | 5/2016 |
| WO | WO 2016/060676 A1 | 4/2016 |
| WO | WO 2017/068029 A1 | 4/2017 |

OTHER PUBLICATIONS

Preliminary Search Report for French Application No. 1852465, dated Nov. 14, 2018.
(Continued)

*Primary Examiner* — Robert K Carpenter
(74) *Attorney, Agent, or Firm* — Wolf, Greenfield & Sacks, P.C.

(57) ABSTRACT

A display device including a first integrated circuit including: an assembly of light-emitting diodes, each diode including a vertical stack of a first semiconductor layer of a first conductivity type and of a second semiconductor layer of a second conductivity type; and on the side of a surface of the first circuit opposite to the first semiconductor layer, a connection structure including a dielectric layer having a plurality of identical or similar connection pads, regularly distributed across the entire surface of the first circuit, arranged therein, each diode having a first electrode in contact with at least one pad of the connection structure, and a second electrode in contact with a plurality of pads of the
(Continued)

connection structure at the periphery of the plurality of diodes.

15 Claims, 5 Drawing Sheets

(51) Int. Cl.
*H01L 33/62* (2010.01)
*H01L 33/32* (2010.01)
*H01L 25/16* (2006.01)
*H01L 33/00* (2010.01)

(52) U.S. Cl.
CPC ............ *H01L 33/382* (2013.01); *H01L 33/62* (2013.01); *H01L 33/0093* (2020.05); *H01L 2933/0066* (2013.01)

(56) References Cited

OTHER PUBLICATIONS

International Search Report and Written Opinion for International Application No. PCT/FR2019/050608, dated May 27, 2019.
International Preliminary Report on Patentability for International Application No. PCT/FR2019/050608, dated Oct. 1, 2020.

\* cited by examiner

LED EMISSIVE DISPLAY DEVICE AND METHOD FOR PRODUCING SUCH A DEVICE

This application is a national stage filing under 35 U.S.C. § 371 of International Patent Application Serial No. PCT/FR2019/050608, filed Mar. 18, 2019, which claims priority to French patent application FR18/52465. The entire contents of these applications are incorporated herein by reference in their entireties.

BACKGROUND

The present application relates to the field of optoelectronic devices.

It more particularly concerns an emissive display device comprising light-emitting diodes (LEDs), also called micro LED display, and a method of manufacturing such a device.

DISCUSSION OF THE RELATED ART

An emissive display device comprising an assembly of a plurality of LEDs, for example made of gallium nitride, and a control circuit enabling to individually control the LEDs in order to display images, have already been provided.

The case where the control circuit is integrated inside and on top of a semiconductor substrate, for example, a silicon substrate, for example, in CMOS technology, is here more particularly considered.

To form such a device, it may be provided to separately manufacture the control circuit and the LED assembly, and then to connect them to each other to form the display device. On the side of one of its surfaces, the control circuit comprises a plurality of metal pads, each pad being intended to be connected to an electrode of a LED of the LED assembly, to be able to individually control the LEDs. The LED assembly is for example monolithically formed on a support substrate, and then transferred onto the control circuit so that each LED has an electrode (anode or cathode) connected to one of the metal pads of the control circuit.

An issue lies in the need to accurately align the control circuit and the LED assembly during the step of assembly of the two elements, so that each LED is effectively positioned on the metal pad corresponding thereto in the control circuit. Such an alignment is particularly difficult to achieve when the pitch between pixels decreases, and is an obstacle to an increase in the resolution and/or in the integration density of the pixels.

SUMMARY

Thus, an embodiment provides a display device comprising a first integrated circuit comprising:

an assembly of a plurality of light-emitting diodes, each diode comprising a vertical stack of a first semiconductor layer of a first conductivity type and of a second semiconductor layer of the second conductivity type, and the diodes being separated from one another by trenches;

for each diode, a first electrode arranged on top of and in contact with the surface of the second layer opposite to the first layer;

a second electrode common to said plurality of diodes, the second electrode extending in the trenches and at the periphery of the plurality of diodes and being in contact, in each diode, with the first semiconductor layer; and on the side of a surface of the first circuit opposite to the first semiconductor layer, a connection structure comprising a dielectric layer having a plurality of identical or similar connection pads, regularly distributed across the entire surface of the first circuit, arranged therein, each diode having its first electrode in contact with at least one pad of the connection structure, and the second electrode being in contact with a plurality of pads of the connection structure at the periphery of the plurality of diodes.

According to an embodiment, the device further comprises a second integrated circuit formed inside and on top of a semiconductor substrate, the second circuit comprising, for each diode of the first circuit, a metal pad intended to be connected to the first electrode of the diode, and a metal electrode intended to be connected to the second electrode of the first circuit.

According to an embodiment, the first and second circuits are bonded to each other by direct hybrid bonding so that each first electrode of the first circuit is electrically connected to a metal pad of the second circuit, and so that the second electrode of the first circuit is electrically connected to the electrode of the second circuit.

According to an embodiment, the second circuit comprises a connection structure comprising a dielectric layer having a plurality of identical or similar connection pads, regularly distributed across the entire surface of the second circuit, arranged therein, each metal pad of the second circuit being in contact with at least one connection pad of the connection structure of the second circuit, and the electrode of the second circuit being in contact with a plurality of connection pads of the connection structure of the second circuit in a peripheral region of the electrode of the second circuit.

According to an embodiment, the second circuit comprises, for each metal pad of the second circuit, an elementary control cell comprising one or a plurality of transistors, enabling to control the current flowing through the corresponding diode of the first circuit and/or a voltage applied across the corresponding diode of the first circuit.

According to an embodiment, the second circuit is made in CMOS technology.

According to an embodiment, the diodes of the first circuit are gallium nitride diodes.

According to an embodiment, in the first circuit, each light-emitting diode further comprises an emissive layer between the first and second semiconductor layers of the diode.

Another embodiment provides a method of manufacturing a display device such as defined hereabove, wherein the forming of the first circuit comprises the successive steps of:

a) successively depositing, on a surface of a support substrate, a vertical stack comprising, in the order from said surface of the substrate, the first and second semiconductor layers and a metal layer;

b) forming, from the surface of the stack opposite to the support substrate, trenches crossing said stack across its entire height and delimiting the different diodes of the first circuit; and c) forming, in said trenches, a metallization in contact, at the level of each diode, with the first semiconductor layer of the stack.

According to an embodiment, step b) comprises a first step of partial forming of the trenches down to an intermediate level of the first semiconductor layer, followed by a step of deposition of an insulating layer on the trench sides, followed by a step of extension of the trenches down to the lower surface of the first semiconductor layer.

According to an embodiment, the metallization formed at step c) extends all along height of the trench.

According to an embodiment, the metallization formed at step c) extends over a portion only of the height of the trenches, up to an intermediate level of the first semiconductor layer, the upper portion of the trenches being filled with an insulating material.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1A:
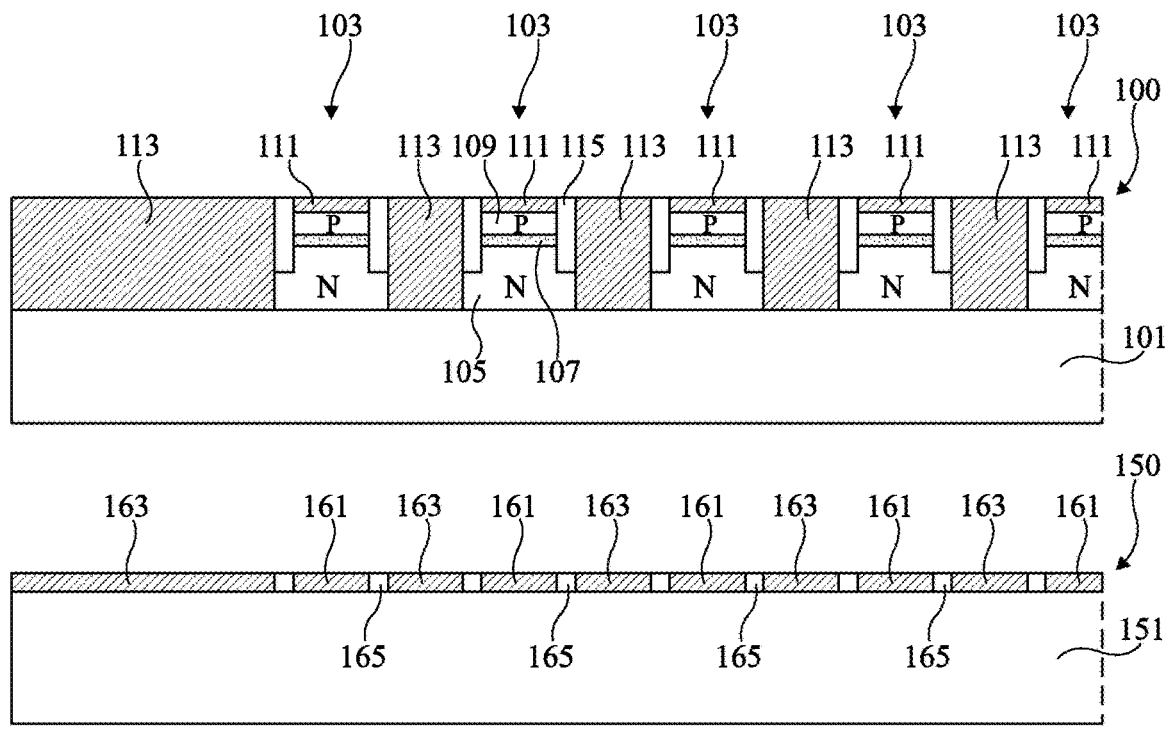
FIGS. 1A and 1B are cross-section views schematically and partially illustrating successive steps of an example of a method of manufacturing an emissive LED display device.

The same elements have been designated with the same reference numerals in the various drawings and, further, the various drawings are not to scale. For the sake of clarity, only the elements that are useful for an understanding of the embodiments described herein have been illustrated and described in detail. In particular, the forming of an integrated LED control circuit has not been detailed, the described embodiments being compatible with usual structures and methods of manufacturing of such control circuits. Further, the composition and the layout of the different layers of an active LED stack have not been detailed, the described embodiments being compatible with usual active LED stacks. In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described devices and assemblies may be oriented differently. Unless specified otherwise, the terms "approximately", "substantially", and "in the order of" signify within 10%, preferably within 5%, of the value in question.

Figure 1B:
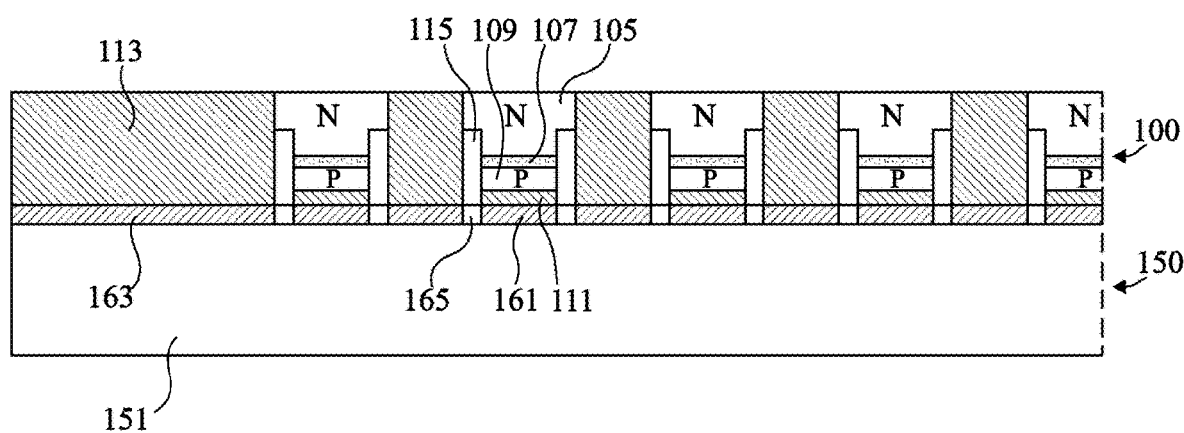

FIGS. 1A and 1B are cross-section views partially and schematically illustrating successive steps of an example of a method of manufacturing an emissive LED display device.

FIG. 1A illustrates an initial step during which a first integrated circuit 100 comprising a plurality of LEDs and a second integrated circuit 150, corresponding to the LED control circuit, are separately manufactured.

Circuit 100 comprises a support substrate 101, for example, made of sapphire, of silicon, of gallium nitride (GaN), or of any other material on which an active LED stack may be deposited. Circuit 100 further comprises a plurality of LEDs 103, for example, identical or similar, arranged on the upper surface of support substrate 101. In top view, LEDs 103 are for example arranged in an array of rows and columns, for example, regularly distributed on the upper surface of substrate 101. Each LED 103 comprises a vertical stack comprising, in the following order from the upper surface of substrate 101, a first doped semiconductor layer 105 of a first conductivity type, for example, type N, an emissive layer 107, and a second doped semiconductor layer 109 of a second conductivity type, for example, type P. Layers 105 and 109 are for example made of gallium nitride. Emissive layer 107 is for example formed by a stack of one or a plurality of emissive layers, each forming a quantum well, for example, based on GaN, InN, InGaN, AlGaN, AN, AlInGaN, GaP, AlGaP, AlInGaP, or of a combination of one or a plurality of these materials. As a variation, emissive layer 107 may be an intrinsic gallium nitride layer, that is, it is not intentionally doped. More generally, it will be within the abilities of those skilled in the art to select the material(s) of emissive layer 107 according to the desired emission wavelength, for example, for an emission in the visible range, in the ultraviolet range, or in the infrared range.

In the present example, the lower surface of emissive layer 107 is in contact with the upper surface of layer 105, and the upper surface of emissive layer 107 is in contact with the lower surface of layer 109. In practice, according to the nature of substrate 101, a stack of one or a plurality of buffer layers (not shown) may form an interface between support substrate 101 and semiconductor layer 105.

The elementary LEDs 103 of circuit 100 are separated from one another by vertical trenches extending, in the present example, across the entire thickness of the stack of layers 105, 107, and 109 and emerging onto the upper surface of support substrate 101 or, if present, of the buffer layer (not shown) separating support substrate 101 from semiconductor layer 105. More particularly, in this example, the LED separation trenches form, in top view, a grid such that each mesh of the grid comprises a single LED 103, and such that each LED 103 is arranged in a mesh of the grid.

Circuit 100 comprises, for each LED 103, a metal electrode 111 arranged on top of and in contact with the upper surface of the semiconductor layer 109 of the LED. In this example, electrode 111 extends all over the upper surface of the semiconductor layer 109 of the LED.

Circuit 100 further comprises a metal electrode 113 common to all LEDs 103. Electrode 113 extends in the trenches separating LEDs 103 and at the periphery of the assembly of LEDs 103. In top view, electrode 113 forms a continuous grid such that each mesh of the grid contains a single LED 103 and such that each LED 103 is arranged in a mesh of the grid. In each LED 103, the lower semiconductor layer 105 of the LED is in contact with common electrode 113. More particularly, in the shown example, electrode 113 is in contact with a lower portion of the sides of the semiconductor layer 105 of the LED, all along the periphery of the LED. In this example, each LED 103 further comprises, in an upper portion of the LED, a peripheral insulating wall 115, made of a dielectric material, in contact, all along the LED periphery, with the sides of the upper electrode 111, of the semiconductor layer 109, and of the emissive layer 107 of the LED, as well as with an upper portion of the sides of the semiconductor layer 105 of the LED. Peripheral insulating wall 115 particularly enables to electrically insulate electrode 113 from electrode 111 and from layers 109 and 107 of the LED.

In the present example, the upper surface of electrode 113, the upper surfaces of electrode 109, and the upper surfaces of insulating walls 115 are substantially at the same level (that is, substantially coplanar) and define a substantially planar continuous surface, forming the connection surface of circuit 100. Thus, the connection surface of circuit 100 comprises an alternation of metal regions (electrodes 111 and 113) and of dielectric regions (insulating walls 115).

Control circuit 150 is formed inside and on top of a semiconductor substrate 151, for example, a silicon substrate. In this example, control circuit 150 comprises, on its upper surface side, for each of the LEDs of circuit 100, a metal connection pad 161 intended to be connected to the electrode 111 of the LED, to be able to control a current flowing through the LED and/or to apply a voltage across the LED. Control circuit 150 further comprises, for each LED, connected to the metal pad 161 dedicated to the LED, an elementary control cell (not detailed) comprising one or a plurality of transistors, enabling to control the current flowing through the LED and/or a voltage applied across the LED. Control circuit 150 is for example made in CMOS technology.

In the shown example, control circuit 150 further comprises, on its upper surface side, a metal electrode 163 intended to be connected to the common electrode 113 of LED circuit 100. Each elementary control cell of circuit 150 is for example connected to electrode 163.

In the shown example, pads 161 and electrode 163 of integrated circuit 150 have, in top view, substantially the same dimensions and the same layout as the electrodes 111 and 113 of LED circuit 100. In other words, in this example, in top view, electrode 163 forms a continuous grid such that each mesh of the grid contains a single pad 161 and such that each pad 161 is arranged in a mesh of the grid.

Pads 161 are laterally separated from electrode 163 by a ring 165 made of a dielectric material, for example, silicon oxide. In this example, rings 165 have, in top view, substantially the same dimensions and the same layout as the insulating walls 115 of circuit 100.

In this example, the upper surface of electrode 163, the upper surfaces of pads 161, and the upper surfaces of insulating rings 165 are substantially at the same level (that is, substantially coplanar) and form together a substantially planar continuous surface, forming the connection surface of circuit 150. Thus, the connection surface of circuit 150 comprise an alternation of metal regions (pads 161 and electrode 163) and of dielectric regions (regions 165), forming a pattern identical or similar to the pattern formed by the metal and dielectric regions of the connection surface of circuit 100.

FIG. 1B illustrates a step subsequent to the forming of the circuits 100 and 150 of FIG. 1B, during which LED circuit 100 is placed on control circuit 150, with its connection surface facing the connection surface of control circuit 150. During this step, the connection surface of LED circuit 100 (that is, its lower surface in the orientation of FIG. 1B) is bonded to the connection surface of control circuit 150 (that is, its upper surface in the orientation of FIG. 1B) so that each electrode 111 of LED circuit 100 is in mechanical and electric contact with a metal pad 161 of control circuit 150 and so that the common electrode 113 of LED circuit 100 is in mechanical and electric contact with electrode 163 of control circuit 150.

In this example, the connection surface of LED circuit 100 is bonded to the connection surface of control circuit 150 by direct hybrid bonding, that is, by direct metal-to-metal bonding of the electrodes 111 of circuit to the connection pads 161 of circuit 150 and of the electrode 113 of circuit 100 to the electrode 163 of circuit 150, and by direct dielectric-to-dielectric bonding of the insulating walls 115 of circuit 100 to the insulating rings 165 of circuit 150. Direct bonding here means a molecular-type bonding, with no addition of adhesive or solder material at the interface between LED circuit 100 and control circuit 150.

FIG. 1B further illustrates a step subsequent to the bonding of LED circuit 100 to control circuit 150, during which the support substrate 101 of LED circuit 100 is removed. While a buffer layer was provided between support substrate 101 and the semiconductor layer 105 of LED circuit 100, the buffer layer may also be removed during this step, to expose the surface of semiconductor layer 105 opposite to control circuit 150 (that is, its upper surface in the orientation of FIG. 1B). In this example, the display device is indeed intended to emit light on the side of its surface opposite to control circuit 150, that is, it upper surface in the orientation of FIG. 1B.

The provision of a direct hybrid bonding between LED circuit 100 and control circuit 150 is advantageous in that it enables to obtain a particularly accurate alignment of LED circuit 100 relative to control circuit 150. Indeed, in the case of a direct bonding, once the two circuits have been aligned, a simple placing into contact of the circuits is sufficient to set the final position of LED circuit 100 relative to control circuit 150. In other words, the bonding is instantaneous. This is a difference with a bonding with an addition of material, for example, by soldering, where a compression and/or heating step should be implemented after the alignment and the placing into contact of the two circuits, which may result in a misalignment of the circuits.

A problem which is posed in the method described in relation with FIGS. 1A and 1B is that the rate of occupation of the connection surface of LED circuit 100 by metal (and accordingly the rate of occupation of the connection surface of control circuit 150 by metal, the connection surfaces of the two circuits being symmetrical) is relatively high, typically greater than 70%, and for example, greater than 80%. Indeed, the connection surface of LED circuit 100 is essentially formed by the metal of the electrodes 111 and 113 of the LEDs, the dielectric material of insulating walls 115 only occupying a small portion of the connection surface.

Further, the distribution of the metal on the connection surface of LED circuit 100 (and accordingly the distribution of the metal on the connection surface of control circuit 150) is not homogeneous. Indeed, as shown in FIGS. 1A and 1B, the metal gate forming the common electrode 113 of LED circuit 100 may comprise a relatively wide peripheral frame, for example, having a width (distance between the outer edge and the inner edge of the frame) greater than the pitch between pixels (that is, the center-to-center distance between two neighboring LEDs 103) of the device, for example, having a width greater than twice the pitch between pixels of the device. As a result, the rate of occupation of the connection surface of LED circuit 100 by metal is greater at the periphery of the LED assembly than inside of the LED array.

To obtain a direct hybrid bonding of good quality, it would be preferable for the occupation rate of the connection surfaces of circuits 100 and 150 to be lower, and for the distribution of the metal on the connection surfaces of circuits 100 and 150 to be more homogeneous. Indeed, prior to the actual bonding step, the connection surfaces of circuits 100 and 150 are planarized by chemical-mechanical polishing (CMP). The surface evenness obtained during this step conditions the quality of the direct hybrid bonding of the two circuits. However, to obtain a good surface evenness, it is preferably for the rate of occupation of the connection surface by metal to be relatively low, and for the distribution of the metal on the connection surface to be as homogeneous as possible.

Figure 2A:
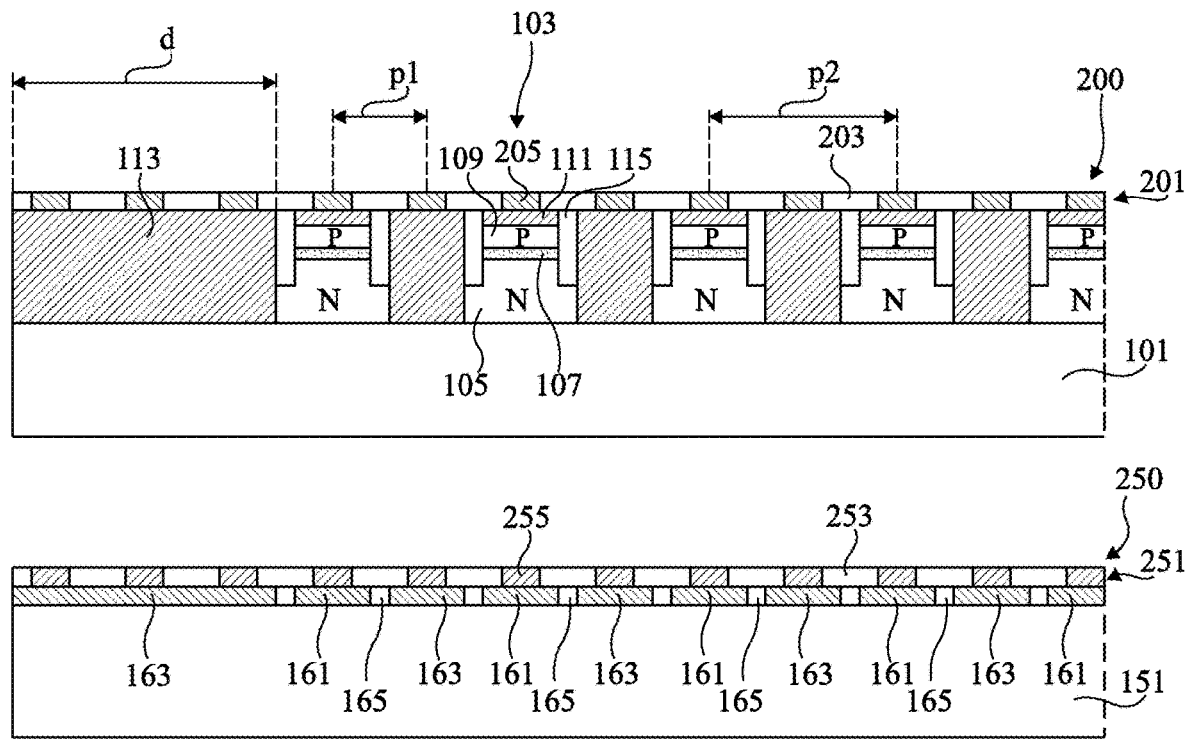
FIGS. 2A and 2B are cross-section views schematically and partially illustrating successive steps of an example of a method of manufacturing an emissive LED display device according to an embodiment.
Figure 2B:
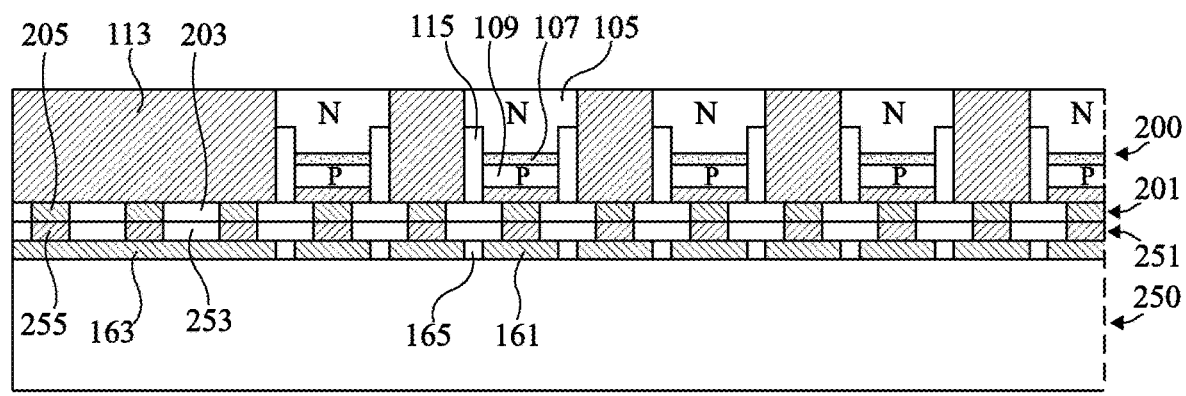

FIGS. 2A and 2B are cross-section view schematically and partially illustrating successive steps of an example of a method of manufacturing an emissive LED display device according to an embodiment.

FIG. 2A illustrates an initial step during which a first integrated circuit 200 comprising a plurality of LEDs and a second integrated circuit 250 corresponding to the LED control circuit are separately manufactured.

The LED circuit 200 of FIG. 2A comprises the same elements as the LED circuit 100 of FIG. 1A, arranged substantially in the same way. These elements will not be detailed again hereafter.

The LED circuit 200 of FIG. 2A differs from the LED circuit 100 of FIG. 1A mainly in that it further comprises, on its upper surface side, a connection structure 201, extending over substantially the entire surface of the circuit.

Connection structure 201 comprises a dielectric layer 203 coating the upper surface of the common electrode 113, of the individual electrodes 111, and of the insulating walls 115 of the circuit (corresponding to the upper surface or connection surface of the circuit 100 of FIG. 1A). As an example, the lower surface of dielectric layer 203 is in contact with the upper surface of common electrode 113, with the upper surface of individual electrodes 111, and with the upper surface of insulating walls 115.

Connection structure 201 further comprises a plurality of separate elementary metal connection pads 205, identical or similar, arranged in through cavities formed in dielectric layer 203. Connection pads 205 extend vertically from the lower surface to the upper surface of dielectric layer 203. In this example, the upper surface of dielectric layer 201 and the upper surfaces of metal pads 205 are substantially at the same level (that is, substantially coplanar) and define a substantially planar continuous surface, forming the connection surface of circuit 200. In this example, the only metal elements visible at the upper surface of connection structure 201 are pads 205. Connection pads 205 are regularly distributed over the entire surface of circuit 200. In top view, connection pads 205 are for example arranged in an array of rows and columns. As an example, in top view, a same elementary pattern formed of a pad 205 surrounded by a portion of dielectric layer 203 is periodically repeated across the entire upper surface of the circuit, in the row and column direction of the LED array. As an example, the pitch between pixels p1 (that is, the center-to-center distance between two neighboring pads 205 of connection structure 201) is substantially identical in the row and column direction of the array, and is substantially identical all over the surface of the array. Preferably, in top view, the rate of occupation of connection structure 201 by the metal pads is in the range from 5 to 50%, for example, in the order of 25%.

In each LED 103 of the LED circuit 200 of FIG. 2A, the electrode 111 of the LED is in contact, by its upper surface, with the lower surface of at least one contact pad 205 of connection structure 201. Further, the common electrode 1113 of the LED circuit is in contact, at the periphery of the assembly of LEDs 103, with a plurality of pads 205 of connection structure 201. In this example, a same pad 205 of the connection structure is only in contact with an electrode 111 or 113 of the LED circuit.

In the shown example, the pitch between pads p1 of connection structure 201 is shorter than the pitch between pixels p2 of circuit 200, so that, inside of LED assembly 103, the common electrode 113 of the circuit is in contact with the pads 205 of connection structure 201. The described embodiments are however not limited to this specific case. As a variant, the pitch between pads p1 of connection structure 201 may be equal or substantially equal to the pitch between pixels p2 of circuit 200, in which case the common electrode 113 of the circuit is in contact with pads 205 only at the periphery of LED assembly 103, and not inside of LED assembly 103. Each connection pad 205 for example has, in top view, a surface area smaller than the surface area of the electrode 111 of a LED of the circuit. As an example, the pitch between pixels p2 of the circuit is in the range from 2 to 30 µm, and the width of the elementary LEDs is in the range from 0.5 to 25 µm.

The control circuit 250 of FIG. 2B is similar to the control circuit 150 of FIG. 1B, but for the fact that, in the example of FIG. 2B, the connection surface of the control circuit is adapted to have the same metallic and dielectric pattern as the connection surface of LED circuit 200.

As an example, the control circuit 250 of FIG. 2B comprises the same elements as the control circuit 150 of FIG. 1B, arranged substantially in the same way, and further comprises, on its upper surface side, a connection structure 251 similar to the connection structure 201 of LED circuit 200, extending over substantially the entire surface of control circuit 250.

In particular, connection structure 251 comprises a dielectric layer 253 coating the upper surface of the common electrode 163, the individual electrodes 161, and the insulating rings 165 of the circuit (corresponding to the upper surface or connection surface of the circuit 150 of FIG. 1A). As an example, the lower surface of dielectric layer 253 is in contact with the upper surface of common electrode 163, with the upper surface of individual electrodes 161, and with the upper surface of insulating rings 165.

Connection structure 251 further comprises a plurality of separate elementary metal connection pads 255, identical or similar, arranged in through cavities formed in dielectric layer 253. Connection pads 255 extend vertically from the lower surface to the upper surface of dielectric layer 253. In this example, the upper surface of dielectric layer 251 and the upper surfaces of metal pads 255 are substantially at the same level (that is, substantially coplanar) and define a substantially planar continuous surface, forming the connection surface of circuit 250. In this example, the only metal elements visible at the upper surface of connection structure 251 are pads 255.

In top view, the dimensions and the distribution of the connection pads 255 of the connection structure 251 of control circuit 250 are identical or similar to the dimensions and to the distribution of the connection pads 205 of the connection structure 201 of LED circuit 200.

Thus, each pad 161 of the control circuit 250 of FIG. 2A is in contact, by its upper surface, with the lower surface of at least one contact pad 255 of connection structure 251. Further, the peripheral portion of the common electrode 163 of control circuit 250 is in contact with a plurality of pads 255 of connection structure 251.

FIG. 2B illustrates a step subsequent to the forming of circuits 200 and 250 of FIG. 2A, during which LED circuit 200 is placed on control circuit 250, with its connection surface facing the connection surface of control circuit 250. During this step, the connection surface of LED circuit 200 (that is, it lower surface in the orientation of FIG. 2B) is bonded to the connection surface of control circuit 250 (that is, its upper surface in the orientation of FIG. 2B) so that each connection pad 205 of LED circuit 200 is in mechanical and electric contact with a connection pad 255 of control circuit 250.

In this example, the connection surface of LED circuit 200 is bonded to the connection surface of control circuit 250 by direct hybrid bonding, that is, by direct metal-to-metal bonding of the connection pads 205 of circuit 200 to the connection pads 255 of circuit 250, and by direct dielectric-to-dielectric bonding of the dielectric layer 203 of circuit 200 to the dielectric layer 253 of circuit 250.

FIG. 2B further illustrates a step subsequent to the bonding of LED circuit 200 to control circuit 250, during which the support substrate 101 of LED circuit 100 and, possibly, a buffer layer (not shown) provided between substrate 101 and semiconductor layer 105, are removed to expose the surface of semiconductor layer 105 opposite to control circuit 250.

An advantage of the embodiment of FIGS. 2A and 2B lies in the provision, on the side of LED circuit 200, of a connection structure 201 and, on the side of control circuit 250, of a corresponding connection structure 251, enabling to obtain, at the level of the connection surfaces of the two circuits, a distribution of the metal patterns better adapted to the forming of a direct hybrid bonding of good quality than the distribution imposed, in the example of FIGS. 1A and 1B, by the constraints of current and/or heat distribution in the LED circuit. In particular, connection structure 201 enables the rate of occupation of the connection surface of LED circuit 200 (and accordingly the rate of occupation of the connection surface of control circuit 250 by metal) to be smaller than the rate of occupation by metal at the level of the upper surface of metal electrodes 111 and 113 of the LED circuit. Further, connection structure 201 enables the distribution of the metal on the connection surface of LED circuit 200 (and accordingly the distribution of the metal on the connection surface of control circuit 250) to be more homogeneous than the metal distribution at the level of the metal electrodes 111 and 113 of the LED circuit.

FIGS. 3A, 3B, 3C, 3D, 3E, 3F, and 3G are cross-section views illustrating in further detail successive steps of an example of a method of manufacturing an emissive LED display screen according to an embodiment. FIGS. 3A, 3B, 3C, 3D, 3E, 3F, and 3G more particularly illustrate successive steps of an example of a method of manufacturing the LED circuit 200 described in relation with FIG. 2A.

Figure 3A:
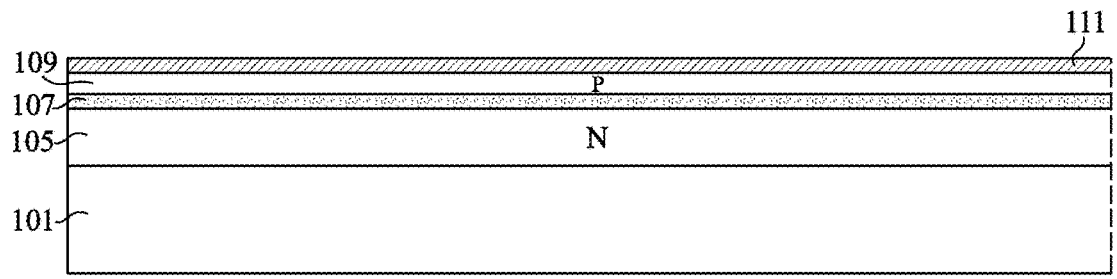
FIGS. 3A, 3B, 3C, 3D, 3E, 3F, and 3G are cross-section views illustrating in further detail successive steps of an example of a method of manufacturing an emissive LED display device according to an embodiment.

FIG. 3A illustrates a step during which semiconductor layer 105, emissive layer 107, and semiconductor layer 109 are successively deposited on the upper surface of support substrate 101, forming an active LED stack. At this stage, layers 105, 107, and 109 continuously extend over substantially the entire upper surface of support substrate 101. Layers 105, 107, and 109 are for example deposited by epitaxy on the upper surface of support substrate 101. In practice, according to the nature of substrate 101, a stack of one or a plurality of buffer layers (not shown) may form an interface between support substrate 101 and lower semiconductor layer 105.

FIG. 3A further illustrates a step of deposition, on top of and in contact with the upper surface of semiconductor layer 109, of a metal layer 111 forming an upper electrode of the active LED stack. In this example, metal layer 111 is continuously deposited over substantially the entire upper surface of layer 109. Metal layer 111 is for example deposited by physical vapor deposition (PVD). As an example, metal layer 111 is made of copper or of titanium.

Figure 3B:
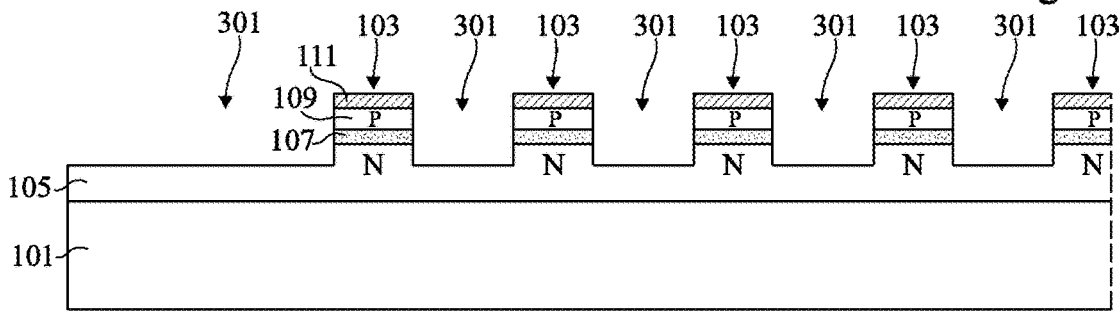

FIG. 3B illustrates a step of forming of trenches 301 extending vertically in the stack of layers obtained at the end of the steps of FIG. 3A, from the upper surface of the stack, that is, from the upper surface of metal layer 111. Trenches 301 thoroughly cross layers 111, 109, and 107 and are interrupted at an intermediate level of lower semiconductor layer 105. In top view, trenches 301 form a continuous grid delimiting the different LEDs 103 of the circuit.

Figure 3C:
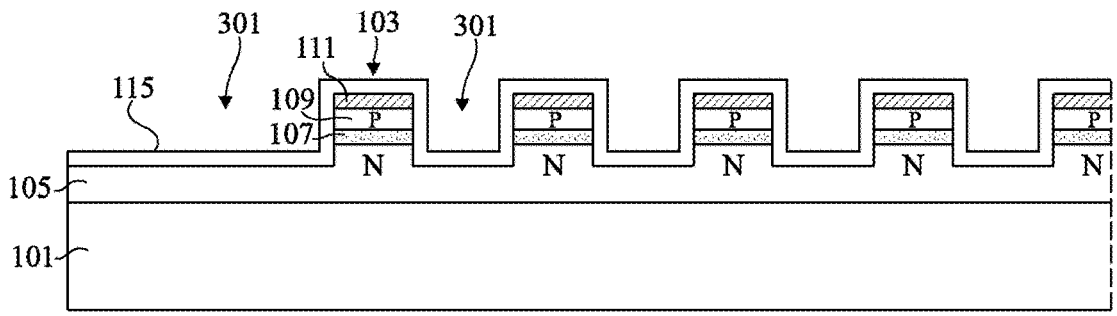

FIG. 3C illustrates a step of deposition of a dielectric layer 115, for example, made of silicon oxide, all over the upper surface of the structure obtained at the end of the steps of FIGS. 3A and 3B, that is, on the sides and on the bottom of trenches 301 and on the upper surface of the upper electrodes 111 of LEDs 103. Layer 115 is preferably deposited by a conformal deposition method, for example, by atomic layer deposition (ALD). As an example, the thickness of insulating layer 115 is in the range from 10 nm to 1 µm.

Figure 3D:
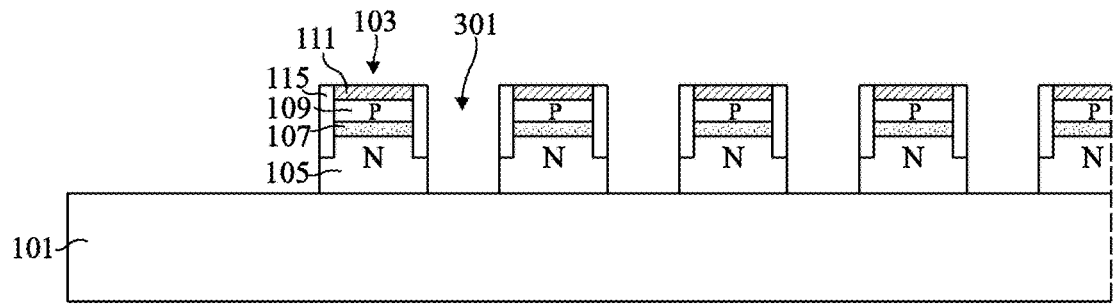

FIG. 3D illustrates a step of removal of dielectric layer 115 from the bottom of trenches 301 and the upper surface of the electrodes 111 of LEDs 103. During this step, layer 115 is kept on the lateral walls of trenches 301. For this purpose, layer 115 is for example etched by vertical anisotropic etching.

FIG. 3D further illustrates a step of removal, by etching, of the portions of semiconductor layer 105 located at the bottom of trenches 301, to continue trenches 301 down to the upper surface of substrate 101, or possibly down to the upper surface of the buffer layer forming an interface between substrate 101 and semiconductor layer 105. At the end of this step, the different LEDs 103 are totally electrically insulated from one another by trenches 301.

Figure 3E:
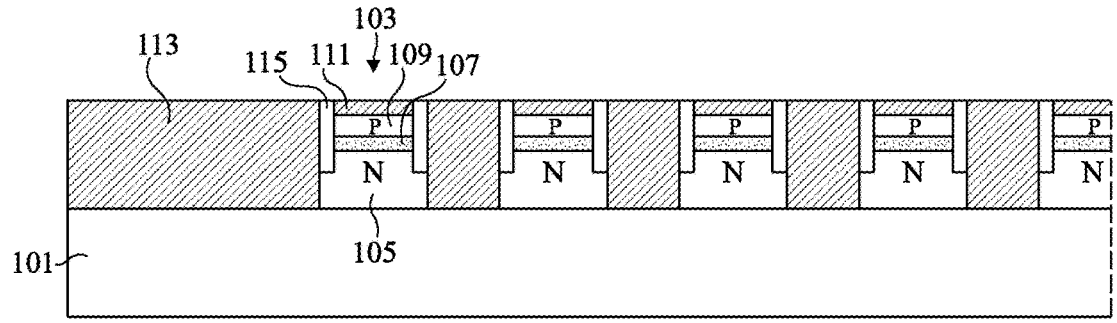

FIG. 3E illustrates a step of deposition of a metallization 113, for example, made of copper or of titanium, on the lateral walls and on the bottom of the trenches 301 obtained at the end of the steps of FIG. 3D. In the shown example, metallization 113 entirely fills trenches 301. As an example, metallization 113 is formed by a damascene-type method, comprising a step of deposition of a metal layer over the entire upper surface of the assembly, with a thickness sufficient to fill trenches 301, followed by a step of chemical-mechanical polishing of the upper surface of the assembly to planarize the upper surface of the device and remove the portions of the metal layer topping LEDs 103, to expose the upper surface of insulating walls 115 (to insulate common electrode 113 from electrodes 111).

Figure 3F:
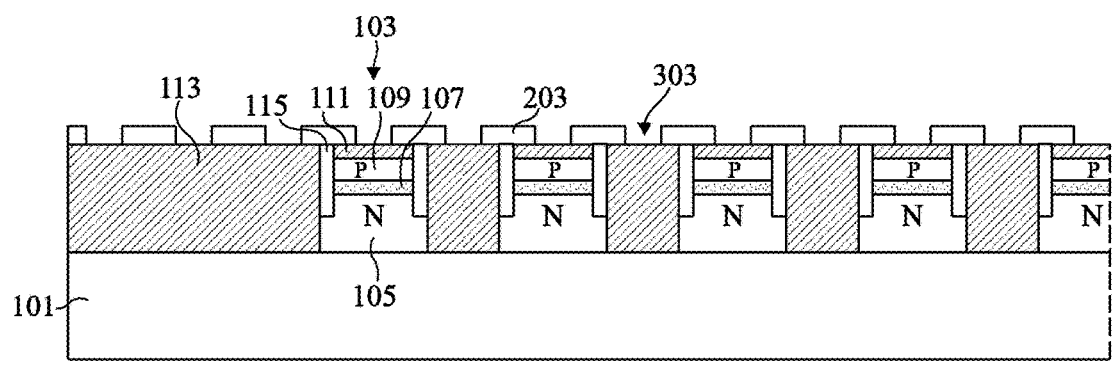

FIG. 3F illustrates a step of deposition of the dielectric layer 203 of connection structure 201, on top of and in contact with the upper surface of the structure obtained at the end of the step of FIG. 3E. Dielectric layer 203 is for example made of silicon oxide or of silicon nitride. Layer 203 is for example deposited by chemical vapor deposition (CVD) or by any other adapted deposition method. Dielectric layer 203 is initially continuously deposited over substantially the entire upper surface of the structure obtained at the end of the steps of FIG. 3E, that is, on the upper surface of electrodes 113 and 111 and on the upper surface of the insulating walls 115 of the circuit.

FIG. 3F further illustrates a step of local etching of dielectric layer 203, to form in layer 203 through openings 303 emerging onto the upper surfaces of electrodes 111 and 113 and intended to contain the connection pads 205 of connection structure 201.

Figure 3G:
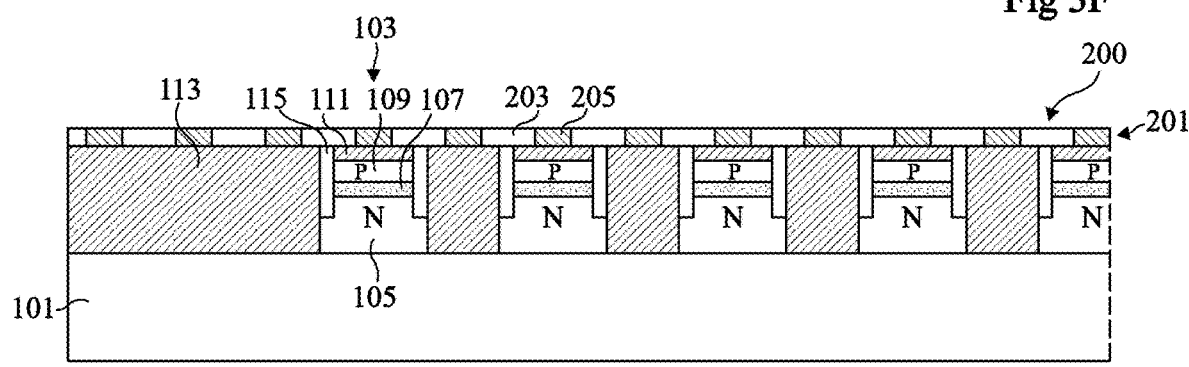

FIG. 3G illustrates a step of filling of openings 303 with metal, for example, titanium or copper, to form the connection pads 205 of connection structure 201. As an example, connection pads 205 are formed by a damascene-type method, comprising a step of deposition of a metal layer over the entire upper surface of the structure obtained at the end of the steps of FIG. 3F, across a thickness sufficient to fill openings 303, followed by a step of chemical-mechanical polishing of the upper surface of the structure to planarize the upper surface of the circuit and remove the portions of the metal layer topping dielectric layer 203 between openings 303, to insulate connection pads 205 from one another.

At the end of this step, a LED circuit 200 identical or similar to that of FIG. 2A, having a substantially planar upper surface or connection surface comprising an alternation of metal regions (pads 205) and of dielectric regions (the portions of layer 203 laterally surrounding pads 205) is obtained.

FIGS. 4A, 4B, 4C, 4D, 4E, and 4F are cross-section views illustrating successive steps of another example of a method of manufacturing an emissive LED device according to an embodiment. FIGS. 4A, 4B, 4C, 4D, 4E, and 4F more particularly illustrates successive steps of an example of a method of manufacturing an alternative embodiment of the LED circuit 200 described in relation with FIG. 2A.

Figure 4A:
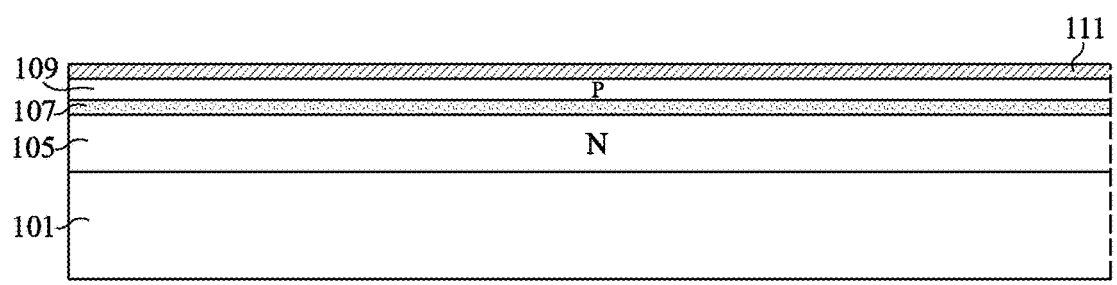
FIGS. 4A, 4B, 4C, 4D, 4E, and 4F are cross-section views illustrating successive steps of another example of a method of manufacturing an emissive LED display device according to an embodiment.

FIG. 4A illustrates a step identical or similar to the step described in relation with FIG. 3A, during which are successively deposited, on the upper surface of support substrate 101, semiconductor layer 105, emissive layer 107, and semiconductor layer 109, forming an active LED stack, and then metal electrode layer 111 on top of and in contact with the upper surface of semiconductor layer 109.

Figure 4B:
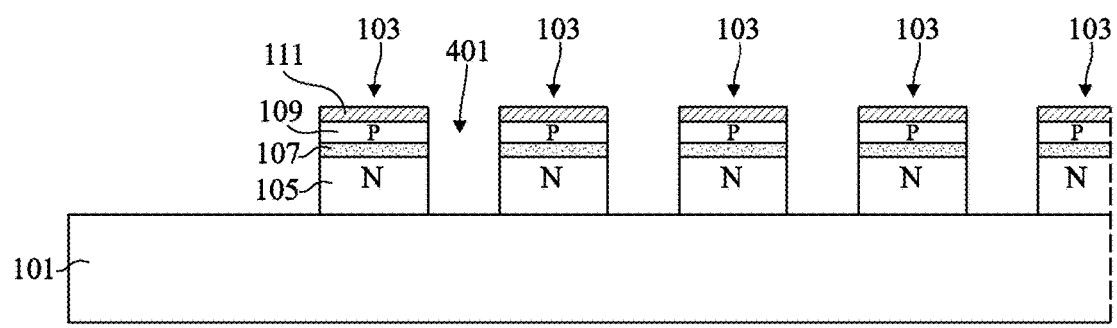

FIG. 4B illustrates a step of forming of trenches 401 vertically extending in the stack of layers obtained at the end of the steps of FIG. 4A, from the upper surface of the stack, that is, from the upper surface of metal layer 111. In this example, trenches 401 thoroughly cross layers 111, 109, 107, 105 and are interrupted on the upper surface of support substrate 101, or, possibly, on the upper surface of a buffer layer forming an interface between substrate 101 and semiconductor layer 105. In top view, trenches 401 form a continuous grid delimiting the different LEDs 103 of the circuit. It should be noted that, in this example, the steps of forming of a peripheral insulating wall 115 in the upper portion of LEDs 103, described in relation with FIGS. 3B, 3C, and 3D, are not provided. Thus, at the end of the trench forming step of FIG. 4B, the sides of layers 111, 109, 107, and 105 of the LEDs are exposed all along their height.

Figure 4C:
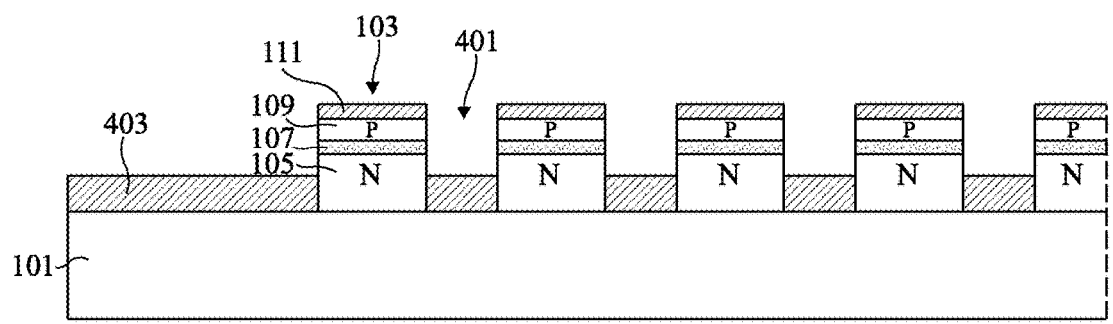

FIG. 4C illustrates a step of partial filling of trenches 401 with a metal layer 403. More particularly, in the present example, metal layer 403 fills the bottom of the trenches, up to a level lower than the upper surface of semiconductor layer 105. In other words, in each LED 103, metal layer 403 is in contact with a lower portion of the sides of the semiconductor layer 105 of the LED, all along the periphery of the LED. Metal layer 403 is however not in contact with the upper portion of the sides of layer 105, nor with the sides of the layers 107, 109, and 111 of LEDs 103.

Figure 4D:
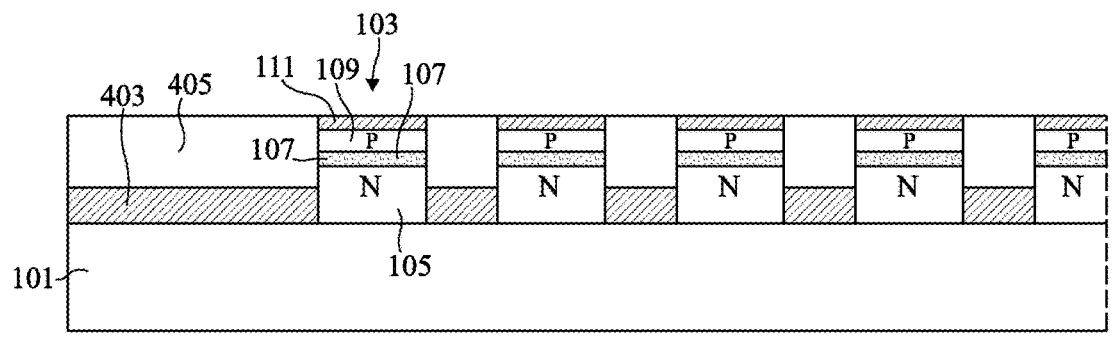

FIG. 4D illustrates a step during which trenches 401 are finally filled with an insulating material 405, for example, silicon oxide. As an example, a layer of insulating material 405 is deposited all over the upper surface of the structure obtained at the end of the steps of FIG. 4C, that is, on top and in contact with the upper surface of metal layer 403, on top of and in contact with the upper portion of the sides of layer 105 and the sides of the layers 107, 109, and 111 of LEDs 103, and on top of and in contact with the upper surface of the electrodes 111 of LEDs 103. As an example, the layer of material 405 is deposited across a thickness greater than the depth of the upper portion of trenches 401 which is not filled with metal layer 403, to entirely fill trenches 401, after which a chemical-mechanical polishing step is implemented to planarize the upper surface of the structure and expose the upper surface of the electrodes 111 of LEDs 103.

Figure 4E:
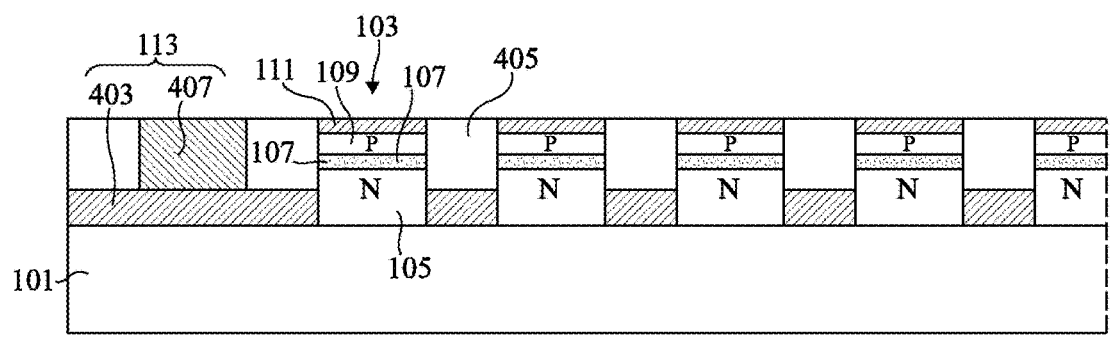

FIG. 4E illustrates a step of electric contacting on metal layer 403. For this purpose, a through opening emerging onto the upper surface of metal layer 413, for example, at the periphery of the assembly of LEDs 103 of the circuit, is first formed in insulating layer 405, from its upper surface. The opening is then filled with a metal 407, for example, by a damascene-type method, to transfer the contact at the level of the upper surface of circuit. In the shown example, contacting metallization 407 is arranged at the periphery of the assembly of LEDs 103 and totally surrounds the assembly of LEDs 103 but does not extend into the assembly of LEDs 103. As a variant, contacting metallization 407 may have a grid-shaped pattern, similar to that of metal layer 403, extending not only at the periphery of the assembly of LEDs 103 but also into the assembly of LEDs 103, between neighboring LEDs of the circuit. At the end of this step, metallizations 403 and 407 define the common electrode 113 of the LED circuit.

Figure 4F:
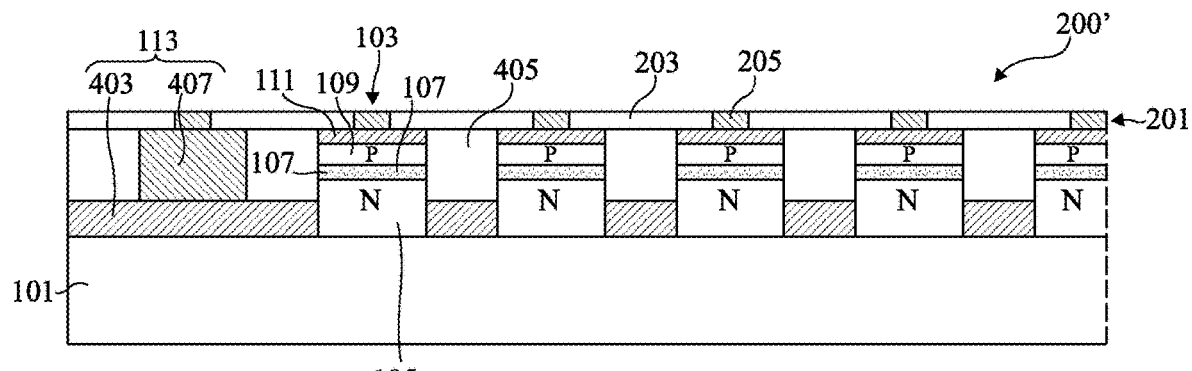

FIG. 4F illustrates a step of deposition of dielectric layer 203 of connection structure 201, on top of and in contact with the upper surface of the structure obtained at the end of the steps of FIG. 4E, and then of forming of metal connection pads 205 in dielectric layer 203, similarly to what has been described in relation with FIGS. 3F and 3G (forming of through openings emerging onto the upper surfaces of metallizations 111 and 407, and filling of the openings with metal to form pads 205).

At the end of this step, a LED circuit 200' similar to the circuit 200 of FIG. 2A is obtained, with the difference that, in circuit 200', an insulator 405 thicker than the peripheral insulating walls 115 of circuit 200 separates LEDs 103 from one another.

Specific embodiments have been described. Various alterations, modifications, and improvements will occur to those skilled in the art. In particular, the described embodiments are not limited to the above-described specific example where the LEDs of the device are based on gallium nitride. More generally, the described embodiments may be applied to any other LED technology.

The invention claimed is:

1. A display device comprising a first integrated circuit comprising:
    an assembly of a plurality of light-emitting diodes, each diode comprising a vertical stack of a first semiconductor layer of a first conductivity type and of a second semiconductor layer of the second conductivity type, and the diodes being separated from one another by trenches;
    for each diode, a first electrode arranged on top of and in contact with the surface of the second layer opposite to the first layer;
    a second electrode common to said plurality of diodes, the second electrode extending in the trenches and at the periphery of the plurality of diodes and being in contact, in each diode, with the first semiconductor layer; and
    on the side of a surface of the first circuit opposite to the first semiconductor layer, a connection structure comprising a dielectric layer having a plurality of identical or similar connection pads, regularly distributed across the entire surface of the first circuit, arranged therein, each diode having its first electrode in contact with at least one pad of the connection structure, and the second electrode being in contact with a plurality of pads of the connection structure at the periphery of the plurality of diodes.

2. The device according to claim 1, further comprising a second integrated circuit formed inside and on top of a semiconductor substrate, the second circuit comprising, for each diode of the first circuit, a metal pad intended to be connected to the first electrode of the diode, and a metal electrode intended to be connected to the second electrode of the first circuit.

3. The device according to claim 2, wherein the first and second circuits are bonded to each other by direct hybrid bonding so that each first electrode of the first circuit is electrically connected to a metal pad of the second circuit and so that the second electrode of the first circuit is electrically connected to the electrode of the second circuit.

4. The device according to claim 2, wherein the second circuit comprises a connection structure comprising a dielectric layer having a plurality of identical or similar connection pads, regularly distributed across the entire surface of the second circuit, arranged therein, each metal pad of the second circuit being in contact with at least one connection pad of the connection structure of the second circuit, and the electrode of the second circuit being in contact with a plurality of connection pads of the connection structure of the second circuit in a peripheral region of the electrode of the second circuit.

5. The device according to claim 2, wherein the second circuit comprises, for each metal pad of the second circuit, an elementary control cell comprising one or a plurality of transistors, enabling to control the current flowing through the corresponding diode of the first circuit and/or a voltage applied across the corresponding diode of the first circuit.

6. The device according to claim 2, wherein the second circuit is made in CMOS technology.

7. The device according to claim 1, wherein the diodes of the first circuit are gallium nitride diodes.

8. The device according to claim 1, wherein, in the first circuit, each light-emitting diode further comprises an emissive layer between the first and second semiconductor layers of the diode.

9. The device according to claim 1, wherein the pitch between pixels of the connection structure of the first integrated circuit is shorter than the pitch between diodes of the first integrated circuit, so that, within the diode assembly of the first integrated circuit, the second electrode common to said plurality of diodes is in contact with pads of the connection structure of the first integrated circuit.

10. The device according to claim 1, wherein the pads of the connection structure of the first integrated circuit are arranged in an array of rows and columns, according to a substantially constant pitch between pixels in the row and column direction of the array.

11. The device according to claim 1, wherein the connection pads of the connection structure of the first integrated circuit are arranged in through cavities formed in the dielectric layer of the connection structure of the first integrated circuit.

12. A method of manufacturing the display device according to claim 1, wherein the forming of the first circuit comprises the successive steps of:
   a) successively depositing, on a surface of a support substrate, a vertical stack comprising, in the order from said upper surface of the substrate, the first and second semiconductor layers and a metal layer;
   b) forming, from the surface of the stack opposite to the support substrate, trenches crossing said stack across its entire height and delimiting the different diodes of the first circuit; and
   c) forming, in said trenches, a metallization in contact, at the level of each diode, with the first semiconductor layer of the stack.

13. The method according to claim 12, wherein step b) comprises a first step of partial forming of the trenches down to an intermediate level of the first semiconductor layer, followed by a step of deposition of an insulating layer on the sides of the trenches, followed by a step of extension of the trenches down to the lower surface of the first semiconductor layer.

14. The method according to claim 13, wherein the metallization formed at step c) extends all along the height of the trench.

15. The method according to claim 12, wherein the metallization formed at step c) extends along a portion only of the height of the trenches, up to an intermediate level of the first semiconductor layer, the upper portion of the trenches being filled with an insulating material.

* * * * *